United States Patent
Kuroi et al.

[11] Patent Number: 5,956,600
[45] Date of Patent: Sep. 21, 1999

[54] METHOD OF MANUFACTURING A SEMICONDUCTOR DEVICE

[75] Inventors: Takashi Kuroi; Maiko Kobayashi, both of Hyogo, Japan

[73] Assignee: Mitsubishi Denki Kabushiki Kaisha, Tokyo, Japan

[21] Appl. No.: 08/792,727

[22] Filed: Jan. 31, 1997

Related U.S. Application Data

[63] Continuation of application No. 08/574,479, Dec. 19, 1995, abandoned.

[30]        Foreign Application Priority Data

Apr. 7, 1995   [JP]   Japan ...................................... 7-082722

[51] Int. Cl.$^6$ .................................................... H01L 21/76
[52] U.S. Cl. ............................................. 438/446; 438/448
[58] Field of Search ..................................... 438/446, 448, 438/FOR 232

[56]               References Cited

U.S. PATENT DOCUMENTS 5,457,067   10/1995   Han .......................................... 437/72

FOREIGN PATENT DOCUMENTS 63-144542   6/1988   Japan .
63-313834   12/1988   Japan .
1161851   6/1989   Japan .
2-304927   12/1990   Japan .
5-90396   4/1993   Japan .
5-182956   7/1993   Japan .

OTHER PUBLICATIONS

"The Swami– A Defect Free and Near–Zero Bird's Beak Local Oxidation Process and it's Application in VLSI Technology," by K.Y. Chiu et al., IEDM 82.

"A Bird's Beak Free Local Oxidation Technology Feasible for VSLI Circuits Fabrication," by Kuang Y. Chiu et al., IEEE 1982.

Primary Examiner—George Fourson
Attorney, Agent, or Firm—McDermott, Will & Emery

[57]                 ABSTRACT

An element isolation region is formed in a silicon substrate by initially depositing an insulating film and first nitride film thereon, forming an opening therethrough exposing the substrate, and etching the substrate to form a groove. A polysilicon film and second nitride film are successively deposited, and the second nitride film is anisotropically etched to expose the polysilicon film at the bottom of the groove. The silicon substrate is then thermally oxidized using the first and second nitride films as a mask to form the element isolation region. In other embodiments, an oxide film is formed at the bottom of the groove prior or subsequent to deposition of the polysilicon film.

31 Claims, 7 Drawing Sheets

METHOD OF MANUFACTURING A SEMICONDUCTOR DEVICE

This application is a continuation of Application Ser. No. 08/574,479 filed Dec. 19, 1995, now abandoned.

TECHNICAL FIELD

The present invention relates to a method of manufacturing a semiconductor device having an element isolation region.

BACKGROUND ART

Figure 8A:
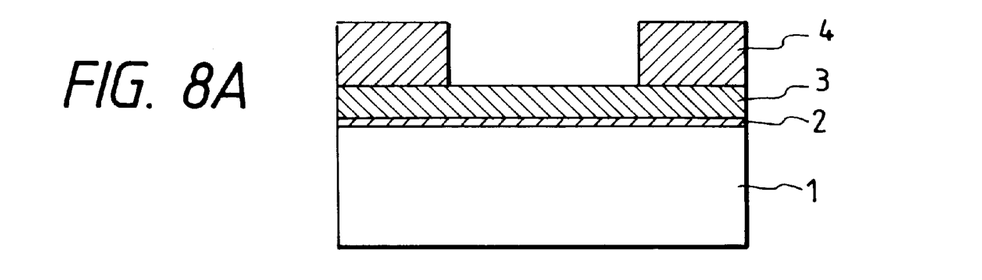
FIGS. 8A to 8E and FIGS. 9A to 9D are sectional views depicting sequential stages of a conventional method for manufacturing a semiconductor device.
Figure 8B:
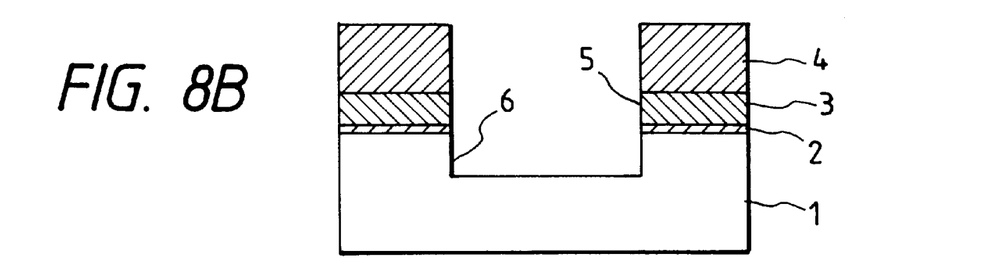

Conventional practices for the manufacture of semiconductor devices comprise the formation of an element isolation region by a technique commonly known as Local Oxidation of Silicon (LOCOS). A conventional method of manufacturing a semiconductor device employing a LOCOS technique is disclosed in Japanese Patent Preliminary Publication No. Hei 5-182956. The initial step comprises the deposition of a first film, typically a silicon oxide film 2 on a silicon substrate 1, as shown in FIG. 8A. A first oxidation resistant film 3, typically a silicon nitride film, is deposited on the silicon oxide film 2. A resist film is then applied and patterned by conventional photolithographic and etching techniques. The patterned resist film 4 is employed as a mask for etching first silicon nitride film 3 and first silicon oxide film 2 to form an opening therethrough exposing the upper surface of silicon substrate 1 forming opening 5, as shown in FIG. 8B. Silicon substrate 1 is then etched to a predetermined depth to form groove 6 therein.

Figure 8C:
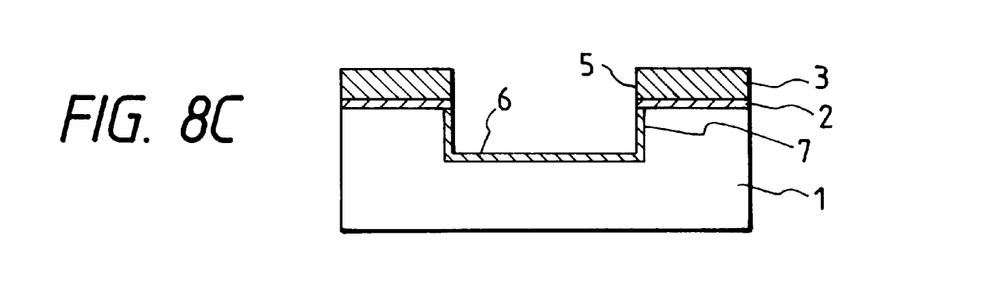
Figure 8D:
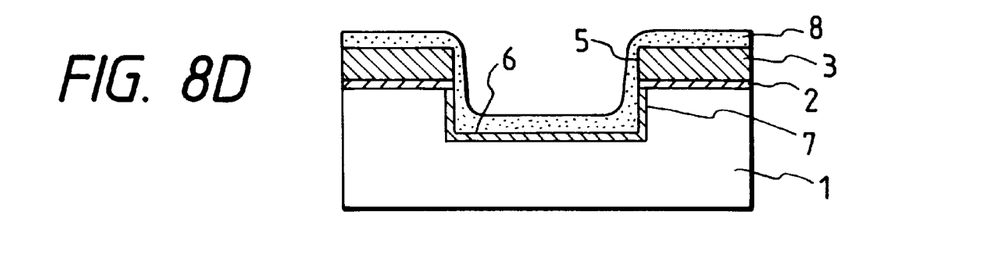
Figure 8E:
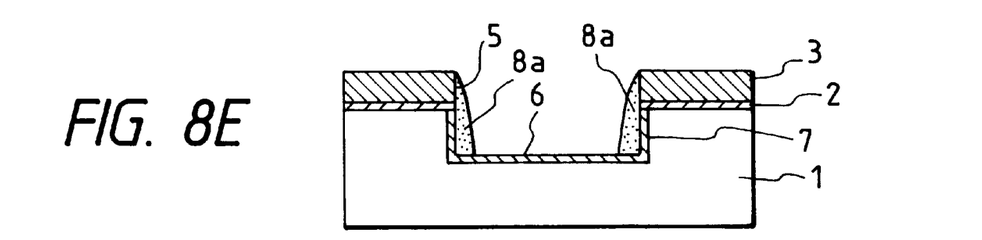

As shown in FIG. 8C, the resist film 4 is removed and the upper surface of silicon substrate 1 is thermally oxidized to form a second silicon oxide film 7 in the groove. As shown in FIG. 8D, a polycrystalline silicon film 8 is then deposited on silicon substrate 1. Polysilicon film 8 is then etched, typically by anisotropical etching, to expose the second silicon oxide film 7 at the bottom of groove 6, leaving a polysilicon sidewall 8a on the opening 5 and groove 6, as shown in FIG. 8E.

Figure 9A:
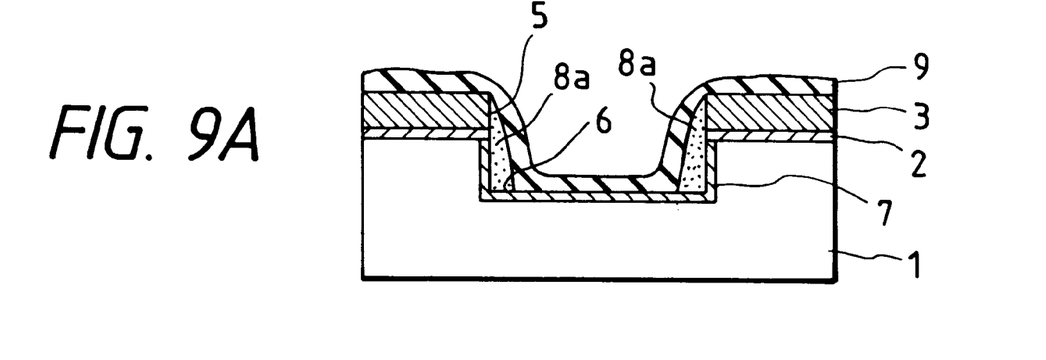
Figure 9B:
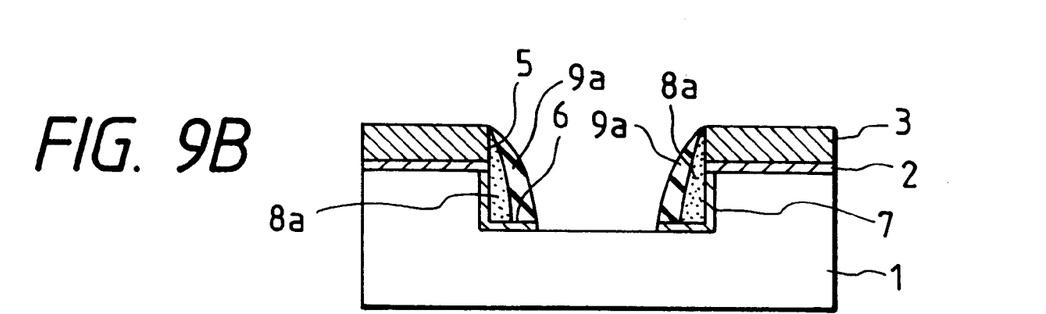
Figure 9C:
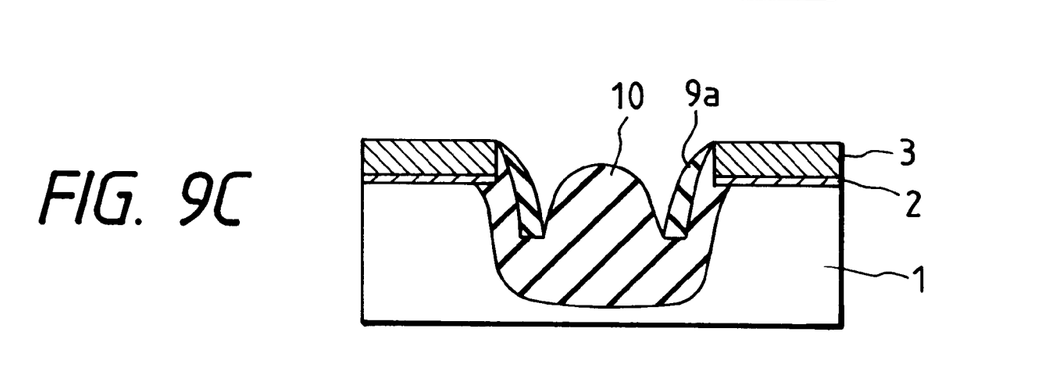

As shown in FIG. 9A, a second silicon nitride film 9 is deposited on silicon substrate 1. The second silicon nitride film 9 is etched, typically by anisotropic etching, to expose the silicon substrate at the bottom of groove 6 leaving a second silicon nitride sidewall 9a as a in opening 5 and groove 6 on polysilicon sidewall 8a, as shown in FIG. 9B. Silicon substrate 1 is then oxidized, as by thermal oxidation, using the first and second silicon nitride films 3 and 9a, respectively, as a mask, to form element isolation region 10, as shown in FIG. 9C.

During thermal oxidation in a conventional LOCOS process, second silicon nitride film 9a retards oxidation in a transverse direction; whereas, polysilicon film 8a relieves stress acting on silicon substrate 1 by second silicon nitride film 9a. Polysilicon film 8a oxidizes more readily than silicon substrate 1. Accordingly, oxidation of polysilicon sidewall 8a occurs more rapidly than that of silicon substrate 1, thereby promoting the oxidation of the silicon substrate in a transverse direction.

Figure 9D:
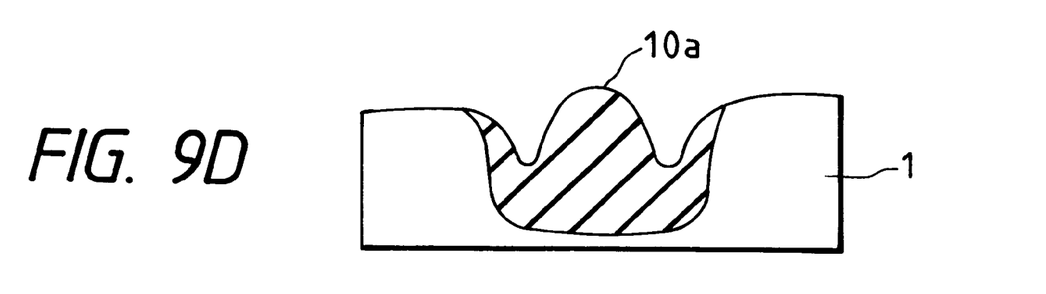

Subsequent to formation of the element isolation region, the first and second silicon nitride films 3 and 9a, respectively, are removed, as with hot phosphate. The first silicon oxide film 2 is then removed as by using hydrofluoric acid to complete element isolation region 10a shown in FIG. 9D.

There are several problems attendant upon conventional methods for manufacturing a semiconductor device employing a LOCOS technique, such as the conventional process described in FIGS. 8A through 9D. For example, during anisotropic etching in which the second silicon nitride sidewall 9a is formed, silicon substrate 1 is exposed at the bottom portion of the groove. Therefore, during anisotropic etching, ions are introduced into the silicon substrate 1 causing damage. Moreover, during thermal oxidation of silicon substrate 1, the second silicon nitride film 9a causes stress to silicon substrate 1 at the portion where there is no separating polysilicon film 8a. Portions of the silicon substrate damaged or stressed exhibit a higher oxidation rate than unstressed and undamaged portions. Moreover, the etching rate, particularly in hydrofluoric acid, is greater for oxidized portions which were not stressed or damaged than portions which have been stressed or damaged. As a result, it is difficult to obtain an element isolation region 10 with a relatively flat upper surface. An element isolation region having a relatively flat upper surface is desirable, because it is difficult to pattern a gate electrode and wirings after forming an element isolation region having a relatively non-uniform upper surface.

In addition to the foregoing, serious problems are generated in regions which have undergone stress from second silicon nitride film 9a. The increased stress from second silicon nitride film 9a generates a crystal lattice in silicon substrate 1, thereby increasing junction leakage current, deteriorating the refresh characteristics of a resulting DRAM and increasing the stand-by of the current device, thereby reducing the yield rate of products and impairing device characteristics.

Furthermore, in forming second silicon nitride sidewall 9a by removing second silicon nitride film 9 from the bottom of groove 6, silicon nitride film 9 is overetched by about 20 to about 30%. Consequently, the ratio of the thickness of the first silicon oxide film and first silicon nitride film is increased, thereby increasing the length of the bird's beak which is dependent upon the ratio of the thickness of the first silicon oxide film to the thickness of the first silicon nitride film.

Accordingly, there exists a need in the semiconductor industry for a LOCOS technique which overcomes the previously discussed problems attendant upon conventional practices to form an element isolation region using LOCOS.

DISCLOSURE OF THE INVENTION

An object of the present invention is a method of manufacturing a semiconductor device having an element isolation region which exhibits a higher uniformity of flatness.

Another object of the present invention is a method of manufacturing a semiconductor device employing a LOCOS technique to form an element isolation region with a reduced bird's beak.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: depositing an insulating film on a silicon substrate; depositing a first oxidation resistant film on the insulating film; forming an opening through the insulating film and the first oxidation resistant film to expose a portion of the upper surface of the silicon substrate; etching the exposed portion of the silicon substrate to a predetermined depth to form a groove in the silicon substrate; depositing a non-monocrystalline silicon film on the silicon substrate; depositing a second oxidation-resistant film on the non-monocrystalline silicon film; anisotropically etching the second oxidation resistant film to expose the non-monocrystalline silicon film at the bottom of the groove, leaving a non-monocrystalline silicon sidewall in the opening and the groove; and thermally oxidizing the silicon substrate using the first and second oxidation resistant films as a mask to form an element isolation region.

Another aspect of the invention is a method in manufacturing a semiconductor device, which method comprises: depositing an insulating film on a silicon substrate; depositing a first oxidation resistant film on the insulating film; forming an opening through the insulating film and the first oxidation resistant film to expose a portion of the silicon substrate; etching the exposed portion of the silicon substrate to a predetermined depth to form a groove in the silicon substrate; depositing a non-monocrystalline silicon film on the silicon substrate; depositing a silicon oxide film on the non-monocrystalline silicon film; depositing a second oxidation resistant film on the silicon oxide film; anisotropically etching the second oxidation resistant film to expose the silicon oxide film at the bottom of the groove, leaving a second oxidation resistant sidewall in the opening and the groove; and thermally oxidizing the substrate using the first and second oxidation resistant films as a mask to form an element isolation region.

A further aspect of the present invention is a method of manufacturing a semiconductor device, which method comprises: depositing an insulating film on a silicon substrate; depositing a first oxidation resistant film on the insulating film; forming an opening through the insulating film and first oxidation resistant film to expose a portion of the silicon substrate; etching the exposed portion of the silicon substrate to a predetermined depth to form a groove in the silicon substrate; forming a silicon oxide film on the exposed portion of the silicon substrate in the groove; depositing a non-monocrystalline film on the silicon substrate; depositing a second oxidation resistant film on the non-monocrystalline silicon film; anisotropically etching the second oxidation resistant film to expose the non-monocrystalline silicon film at the bottom of the groove with the silicon oxide film thereunder, leaving a second oxidation resistant sidewall in the opening and the groove; and thermally oxidizing the silicon substrate using the first and second oxidation resistant films as a mask to form an element isolation region.

Another aspect of the present invention is a method of manufacturing a semiconductor device, which method comprises: depositing an insulating film on a semiconductor substrate; depositing a first oxidation film on the insulating film; forming an opening through the insulating film and the first oxidation resistant film to expose a portion of the silicon substrate; etching the exposed portion of the silicon substrate to a predetermined depth to form a groove in the silicon substrate; forming a silicon oxide film on the exposed portion of the silicon substrate in the groove; depositing a non-monocrystalline silicon film on the substrate; depositing a second oxidation resistant film on the non-monocrystalline silicon film; anisotropically etching the second oxidation resistant film and the non-monocrystalline silicon film to expose the silicon oxide film at the bottom of the groove, leaving a second oxidation resistant sidewall groove with a portion of the polysilicon film thereunder in the groove; thermally oxidizing the silicon substrate using the first and second oxidation resistant films as a mask to form an element isolation region.

A further aspect of the invention is a method of manufacturing a semiconductor device, which method comprises: depositing an insulating film on a silicon substrate; depositing a first oxidation resistant film on the insulating film; forming an opening through the insulating film and the first oxidation resistant film to expose a portion of the silicon substrate; etching the exposed upper portion of the silicon substrate at the opening to a predetermined depth to form a groove in the silicon substrate; forming a silicon oxide film on the exposed portion of the silicon substrate in the groove; depositing a non-monocrystalline film on the silicon substrate; anisotropically etching the non-monocrystalline silicon film to expose the silicon oxide film at the bottom of the groove, leaving a non-monocrystalline silicon sidewall film in the opening and the groove; depositing a second oxidation resistant film on the silicon substrate; anisotropically etching the second oxidation resistant film to expose the silicon oxide film at the bottom of the groove, leaving a second oxidation resistant sidewall in the opening and the groove with the non-monocrystalline silicon sidewall thereunder; and thermally oxidizing the silicon substrate using the first and second oxidation resistant films as a mask to form an element isolation region.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention addresses and solves problems attendant upon conventional methods of manufacturing a semiconductor device employing a LOCOS technique, notably the damage and stresses to the silicon substrate resulting in the formation of an element isolation region having a long bird's beak and a non-uniform or uneven upper surface. In accordance with a first embodiment of the present invention, as shown in FIGS. 1A to 1C and FIGS. 2A to 2C, a non-monocrystalline silicon film is formed at the bottom of the groove which is thermally oxidized to form the element isolation region.

Figure 1A:
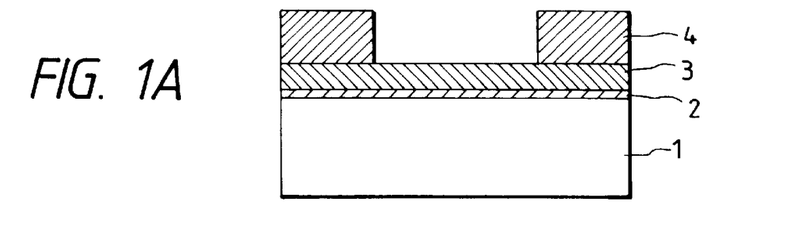
FIGS. 1A to 1C and FIGS. 2A to 2C are sectional views depicting sequential stages of a method of manufacturing a semiconductor device according to an embodiment of the present invention.

As shown in FIG. 1A, a first insulating film 2, preferably comprising silicon oxide, is formed on the surface of semiconductor substrate 1. Preferably, silicon oxide film 2 has a thickness of about 300 Å and is formed by thermal oxidation. A first oxidation resistant film 3 is then formed on silicon oxide film 2. First oxidation resistant film 3 is preferably silicon nitride. Silicon nitride film 3 is preferably formed by chemical vapor deposition (CVD) to a thickness of about 100 Å.

Figure 1B:
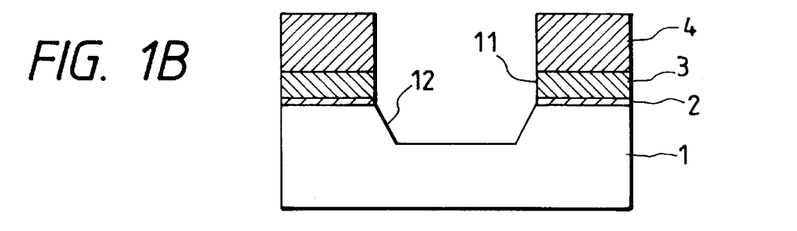

A resist film is then applied on silicon nitride film 3 and patterned by conventional photolithographic and etching techniques to form resist mask 4. Using resist mask 4, first silicon nitride film 3 and first silicon oxide film 2 are etched in a conventional manner to form an opening 11 exposing a portion of the upper surface of silicon substrate 1. The exposed portion of silicon substrate 1 is then etched to a predetermined depth to form groove 12. Preferably, the sidewall of groove 12 is tapered at an angle of about 30° with a perpendicular line to the upper surface of the silicon substrate, as shown in FIG. 1B.

Figure 1C:
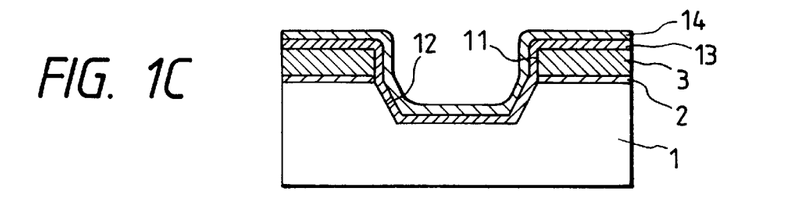

Resist mask 4 is then removed and a non-monocrystalline silicon film 13 is deposited on silicon substrate 1, as shown in FIG. 1C. The non-monocrystalline film 13 is formed on the entire surface of silicon substrate 1 including on the first silicon nitride film 3, in opening 11 and groove 12. The non-monocrystalline silicon film 13 preferably comprises polycrystalline silicon or amorphous silicon. Non-monocrystalline silicon film 13 is preferably deposited by CVD to a thickness of about 300 Å. A second oxidation resistant film 14, preferably comprising silicon nitride, is deposited on non-monocrystalline film 13. Second silicon nitride film 14 is preferably deposited by CVD to a thickness of about 200 Å.

Figure 2A:
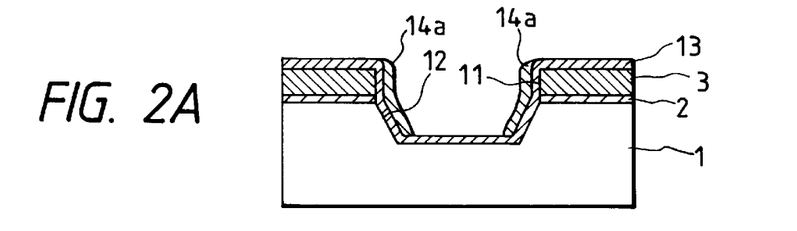

Second silicon nitride film 14 is then anisotropically etched to expose polysilicon film 13 at the bottom of groove 12, leaving second silicon nitride sidewall 14a in opening 11 and groove 12, as shown in FIG. 2A.

In accordance with this embodiment of the present invention, polysilicon film 13 remaining on silicon substrate 1 prevents damage to silicon substrate 1 during anisotropic etching of second nitride film 14. Furthermore, even if overetching is performed to remove the second silicon nitride film 14 at the bottom of groove 12 by about 20 to about 30% of its thickness, film reduction of the first silicon nitride film 3 does not occur, since polysilicon film 13 is formed thereon. Significantly, stress acting on silicon substrate 1 during thermal oxidation is relieved by polycrystalline film 13 on the exposed portion of silicon substrate 1 in the groove.

Figure 2B:
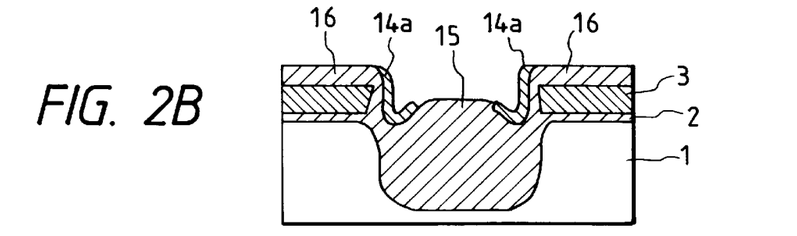

Using the first and second silicon nitride films 3 and 14a, respectively, as a mask, thermal oxidation is conducted to oxidize silicon substrate 1 to form an element isolation film 15. Preferably, element isolation film 15 has a thickness of about 5,000 Å. During thermal oxidation, polysilicon film 13 on first silicon nitride film 3 is oxidized to form a silicon oxide film 16, preferably having a thickness of about 6,000 Å, as shown in FIG. 2B. During thermal oxidation, the second silicon nitride film 14a suppresses advancement of oxidation in a transverse direction. Furthermore, since polysilicon film 13 is more easily oxidized than silicon substrate 1, oxidation of the polysilicon film 13 on the sidewall advances more rapidly than oxidation of silicon substrate 1. Stress acting on silicon substrate 1 by the second silicon nitride film 14a is relieved, since polysilicon film 13 is located entirely between the second silicon nitride film 14a and silicon substrate 1. Furthermore, since the sidewall of groove 12 is tapered, second silicon nitride film 14 swells, thereby further flattening element isolation film 15.

Figure 2C:
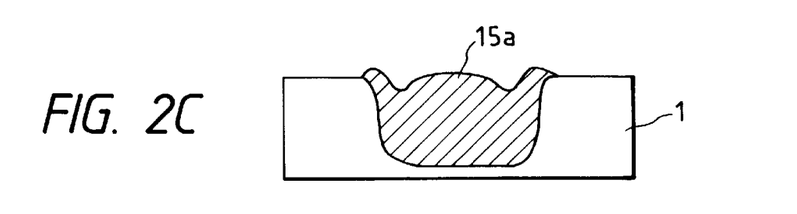

After removal of silicon oxide film 16, as with hydrofluoric acid, first and second silicon nitride films 3 and 14a, respectively, are removed, as with hot phosphoric acid. In addition, first silicon oxide film 2 is removed, as with hydrofluoric acid, thereby forming element isolation region 15a, as shown in FIG. 2C.

Thus, in accordance with the first embodiment, damage to silicon substrate 1 and film reduction of the first silicon nitride film 3 during anisotropic etching to form second silicon nitride sidewall 14a are prevented by the presence of polysilicon film 13. Stress acting on silicon substrate 1 by second silicon nitride film 14a during thermal oxidation of silicon substrate 1 is relieved by the presence of polysilicon film 13. Therefore, crystal defects do not occur within silicon substrate 1. In addition, element isolation region 15a is formed with a uniformly flat upper surface and a relatively short bird's beak. Patterning of the gate electrode and wirings, therefore, is easily achieved during subsequent stages.

Furthermore, unlike conventional practices, second silicon nitride film 14a and polysilicon film 13 constituting the sidewall of groove 12 are formed in such a manner that they are simultaneously etched. Thus, the present invention also provides a simplified and efficient method to form an element isolation region by LOCOS.

Figure 3A:
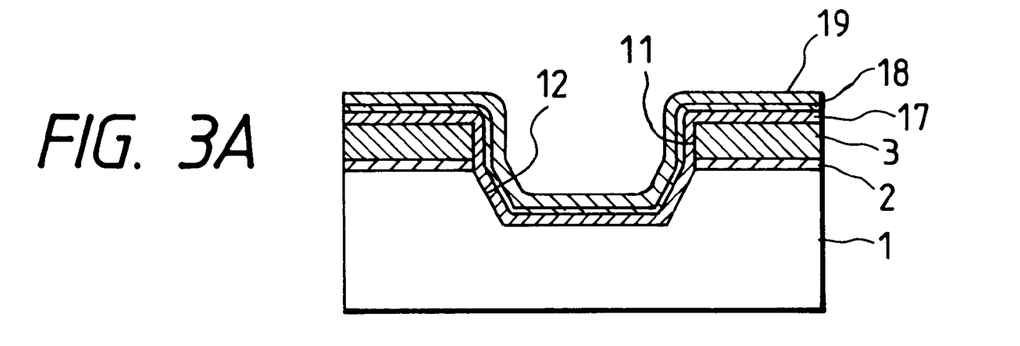
FIGS. 3A to 3D are sectional views showing sequential stages of a method of manufacturing a semiconductor device in accordance with another embodiment of the present invention.

The sequential stages of a method of manufacturing a semiconductor device in accordance with a second embodiment of the present invention are depicted in FIGS. 3A to 3D. As in the first embodiment, an insulating film 2, preferably comprising silicon oxide, and a first oxidation resistant film 3, preferably comprising silicon nitride, are sequentially deposited and patterned employing conventional photolithographic and etching techniques. An opening 11 is formed through silicon oxide film 2 and first silicon nitride film 3 exposing silicon substrate 1, which is etched to form a tapered groove 12 therein, as shown in FIG. 3A. As also shown in FIG. 3A, a polysilicon film 17 is deposited on silicon substrate 1, preferably by CVD to a thickness of about 300 Å. In accordance with this embodiment of the present invention, the upper surface of the non-monocrystalline film 17, preferably comprising polysilicon, is thermally oxidized to form a second silicon oxide film 18 thereon, preferably having a thickness of about 40 Å. A second silicon nitride film 19 is then deposited on silicon substrate 1, preferably by CVD to a thickness of about 20 Å.

Figure 3B:
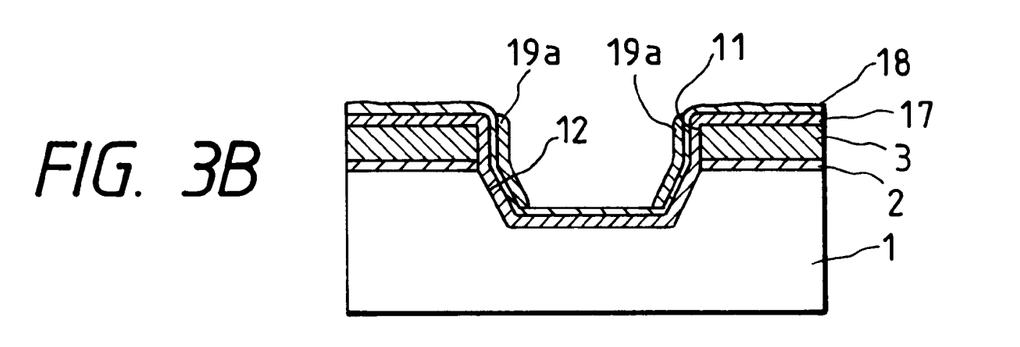
Figure 3C:
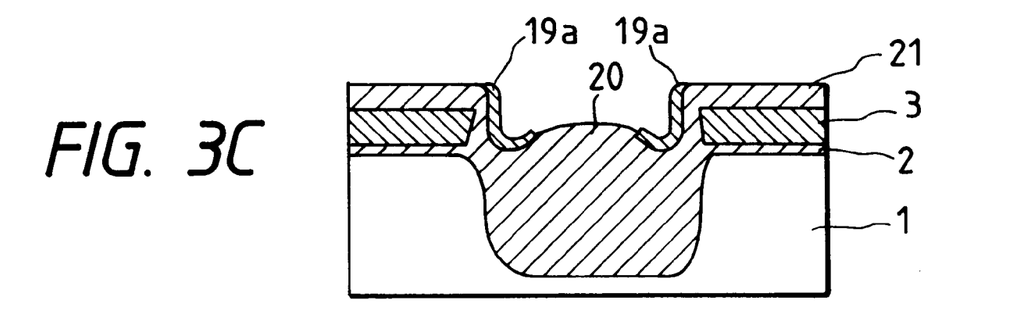

The second silicon nitride film 19 is anisotropically etched to expose second silicon oxide film 18 on the bottom of groove 12, leaving a second silicon nitride sidewall 19a in opening 11 and in groove 12, as shown in FIG. 3B.

Figure 3D:
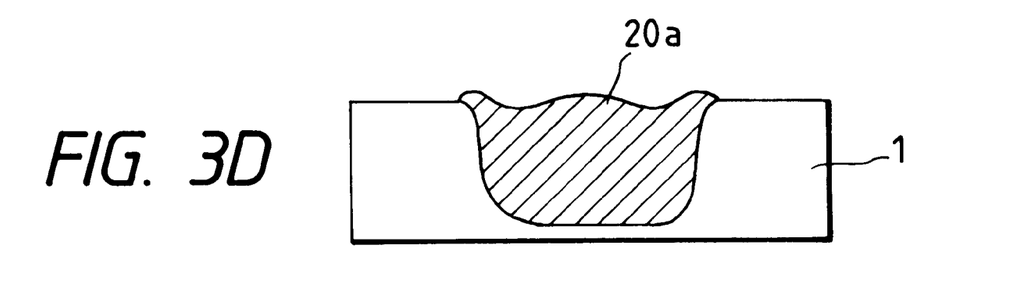

Subsequently, as in the first embodiment, silicon substrate 1 is thermally oxidized to form element isolation film 20. During oxidation, polycrystalline silicon film 17 is also oxidized to form a silicon oxide film 21. Subsequently, silicon oxide film 21, first and second silicon nitride films 3 and 19, respectively, and first silicon oxide film 2 are removed to form element isolation region 20a, as shown in FIG. 3D.

Thus, in accordance with the second embodiment of the present invention, second silicon oxide film 18 and polysilicon film 17 prevent damage to silicon substrate 1 and film reduction of the first silicon nitride film 3 during anisotropic etching to form second silicon nitride sidewall 19a. Stress acting on silicon substrate 1 by the second silicon nitride film 19a during thermal oxidation of silicon substrate 1 is also relieved by second silicon oxide film 18 and polysilicon film 17. Consequently, the bird's beak is further restricted vis-à-vis the first embodiment, thereby further flattening the upper surface of element isolation region 20a.

During thermal oxidation of silicon substrate 1, second silicon oxide film 18 serves as a diffusion layer for an oxidation agent, thereby enhancing oxidation of polycrystalline silicon film 17 and further limiting the formation of a bird's beak. The oxidation of polysilicon film 17 is promoted by diffusing an oxidation agent through second silicon oxide film 18.

The initial sequential stages of a method of manufacturing a semiconductor device in accordance with a third embodiment of the present invention basically correspond to the initial stages depicted in FIGS. 1A and 1B of the first embodiment, wherein insulating film 2, preferably silicon oxide, is deposited on the surface of semiconductor substrate 1, and a first oxidation resistant film 3, preferably silicon nitride, deposited thereon. A photoresist is then deposited and patterned and etched, as by conventional photolithographic and etching techniques, to form resist mask 4. Anisotropic etching is then conducted to form an opening through first silicon nitride layer 3 and first silicon oxide layer 2 exposing a portion of silicon substrate 1, which is then etched to form groove 12.

Figure 4A:
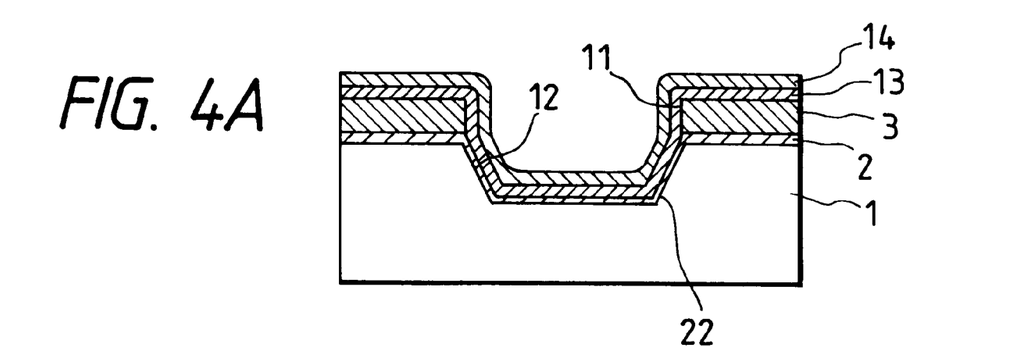
FIGS. 4A to 4D are sectional views depicting sequential stages of a method of manufacturing a semiconductor device in accordance with another embodiment of the present invention.

In accordance with the third embodiment of the present invention, thermal oxidation is then conducted to form a second silicon oxide film 22, preferably having a thickness of about 40 Å, on the exposed portion of silicon substrate 1 in groove 12, as shown in FIG. 4A. Subsequently, as in the first embodiment, a non-monosilicon film 13, preferably comprising polysilicon, is deposited on silicon substrate 1. A second oxidation resistant film 14, preferably silicon nitride, is then deposited on polysilicon film 13.

Figure 4B:
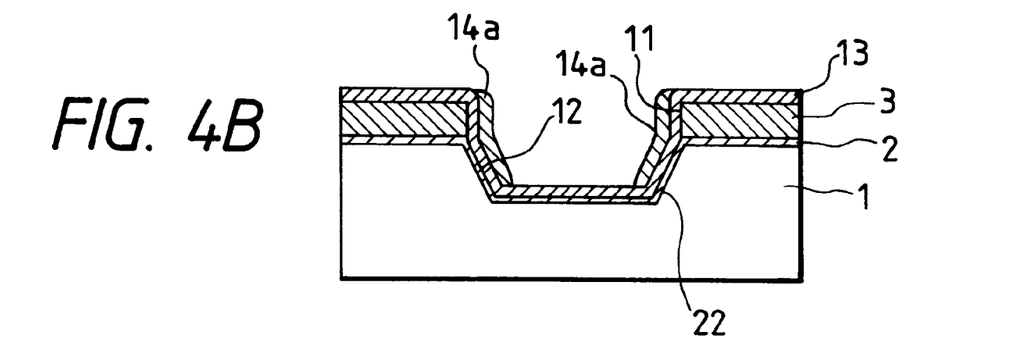

Anisotropic etching is then conducted to etch second silicon nitride film 14, thereby exposing polysilicon film 13 at the bottom of groove 12, leaving second oxide film 22 thereunder, and leaving second silicon nitride sidewall 14a in opening 11 and groove 12, as shown in FIG. 4B.

Figure 4C:
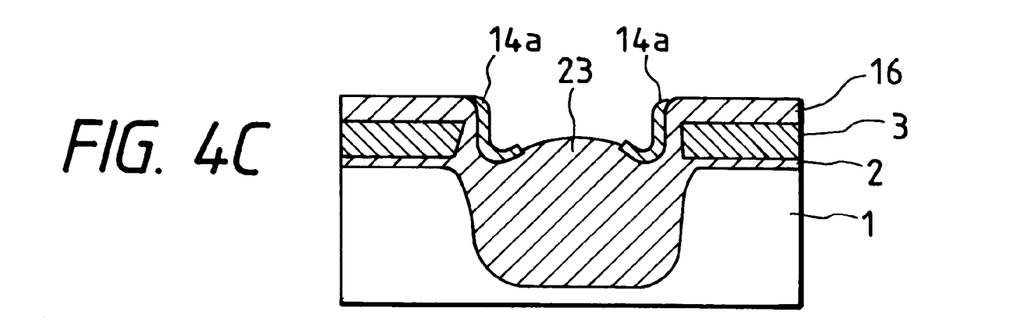
Figure 4D:
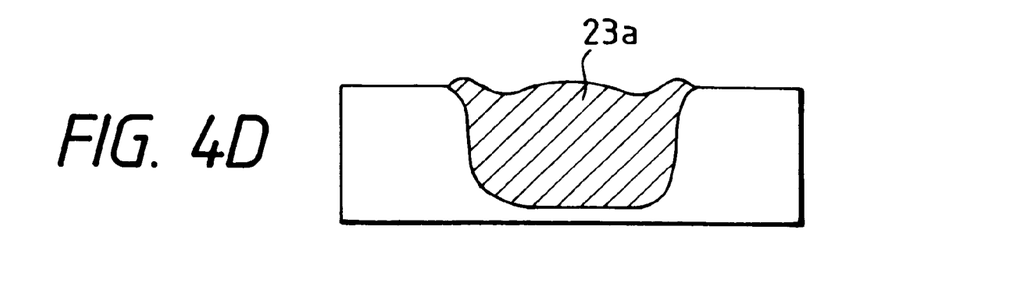

Silicon substrate 1 is then thermally oxidized to form an element isolation oxide film 23, while polysilicon film 13 is oxidized to form silicon oxide film 16 integral with element isolation oxide film 23, as shown in FIG. 4C. Silicon oxide film 16, first and second silicon nitride films 3 and 14a, respectively, and first silicon oxide film 2, are then removed, as by conventional etching techniques, to form element isolation region 23a, as shown in FIG. 4D.

Thus, in accordance with the third embodiment of the present invention, the same advantages are achieved as in the second embodiment of the present invention. In addition thereto, second silicon oxide film 22 serves as a diffusion layer for introducing an oxidation agent to polysilicon film 13 during thermal oxidation of silicon substrate 1. As in the second embodiment, oxidation of the polycrystalline silicon film 13 is enhanced.

As in the previously discussed embodiments of the present invention, the third embodiment of the present invention effectively prevents damage to silicon substrate 1 by leaving second silicon oxide film 22 and polycrystalline silicon film 13 on the bottom of groove 11 during anisotropic etching of second silicon nitride film 14. In addition, as in the previous embodiments, reduction of the film thickness of polysilicon nitride film 3 is prevented by polysilicon film 13. Stress acting on silicon substrate 1 by the second silicon nitride film 14 is relieved by the presence of polysilicon film 13 on the exposed portion of silicon substrate 1 in the groove during thermal oxidation thereof. The oxidation of the polycrystalline silicon film 13 is promoted by diffusing an oxidation agent through silicon oxide film 22.

Figure 5A:
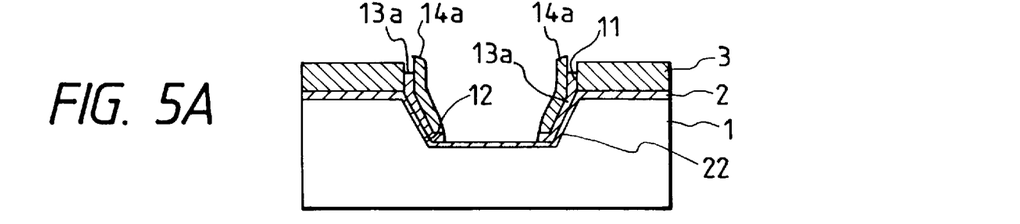
FIGS. 5A to 5C are sectional views showing sequential stages of a method of manufacturing a semiconductor device in accordance with another embodiment of the present invention.
Figure 5B:
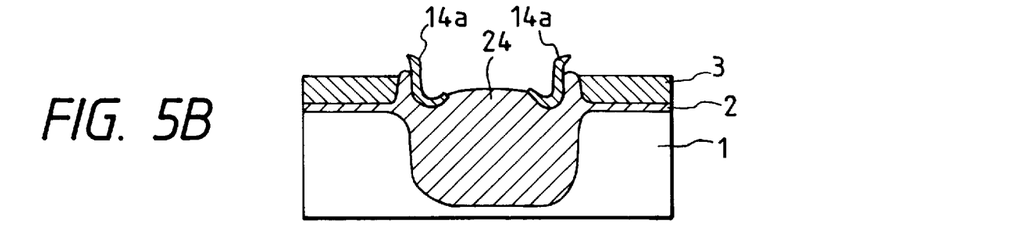
Figure 5C:
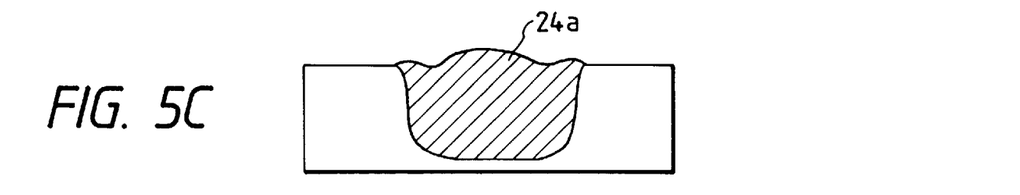

The sequential stages of a method of manufacturing a semiconductor device in accordance with a fourth embodiment of the present invention are depicted in FIGS. 5A to 5C. The initial stages of the fourth embodiment of the present invention, as in the previously disclosed embodiments, comprises the deposition of an insulating film 2, preferably comprising silicon oxide, on semiconductor substrate 1. A first oxidation resistant film 3, preferably comprising silicon nitride, is then deposited on first silicon oxide film 2. A resist is then deposited and patterned employing conventional photolithographic and etching techniques to form a resist pattern. Etching is then conducted to form an opening 11 through first silicon nitride layer 3 and first silicon oxide layer 2, exposing a portion of the surface of silicon substrate 1. Etching is then conducted to form a groove 12 in semiconductor substrate 1. Subsequently, a second silicon oxide film 22 is formed on the silicon substrate in the groove, and a polysilicon film 13 thereon deposited. A second oxidation resistant film 14 is then deposited on polysilicon film 13. Anisotropic etching is then conducted, as in the third embodiment of the present invention, to etch second silicon nitride film 14, thereby exposing polysilicon film 13 at the bottom of groove 12, leaving second oxide film 22 thereunder, and leaving second silicon nitride sidewall 14a in opening 11 and groove 12.

In accordance with the fourth embodiment of the present invention, anisotropic etching of polysilicon film 13 is conducted to expose second silicon oxide film 22 at the bottom of groove 12, leaving polysilicon film 13a on the lower surface of the second silicon nitride film 14a, as shown in FIG. 5A. In accordance with this embodiment of the present invention, a portion of polysilicon film 13a is etched below first silicon nitride film 3.

The silicon substrate 1 is then thermally oxidized to form element isolation oxide film 24, as shown in FIG. 5B. The first and second silicon nitride films 3 and 14a, respectively, and first silicon oxide film 2, are then removed, as by conventional etching techniques, to form element isolation region 24a, as shown in FIG. 5C.

Thus, in accordance with the fourth embodiment of the present invention, the same advantages are achieved as in the previously disclosed first, second and third embodiments of the present invention. In addition, during thermal oxidation of silicon substrate 1 in the fourth embodiment, no silicon oxide film is formed on first silicon nitride film 3. Therefore, during removal of silicon oxide film, the element isolation oxide film 24 is removed so that element isolation region 24a can be formed. Furthermore, since polysilicon film 13 does not remain at the bottom of groove 12, the depth of element isolation region 24a can be further increased by the thickness of polysilicon film 13, thereby further ensuring the effectiveness of the element isolation region 24a.

Figure 6A:
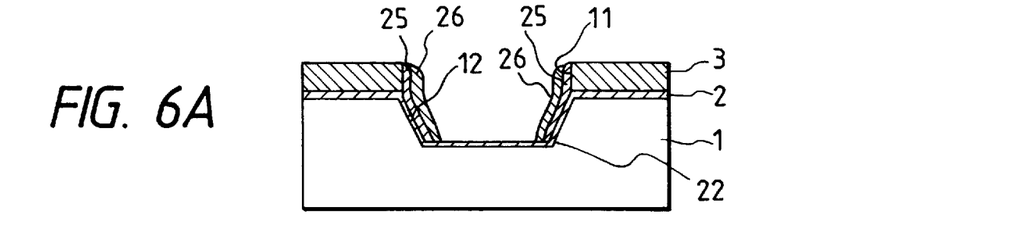
FIGS. 6A to 6C are sectional views depicting sequential stages of a method of manufacturing a semiconductor device in accordance with another embodiment of the present invention.
Figure 6B:
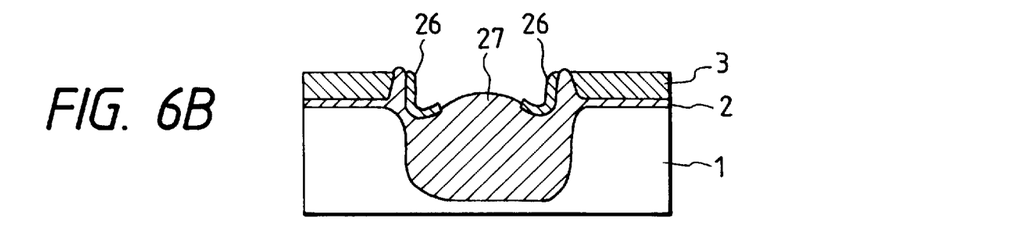
Figure 6C:
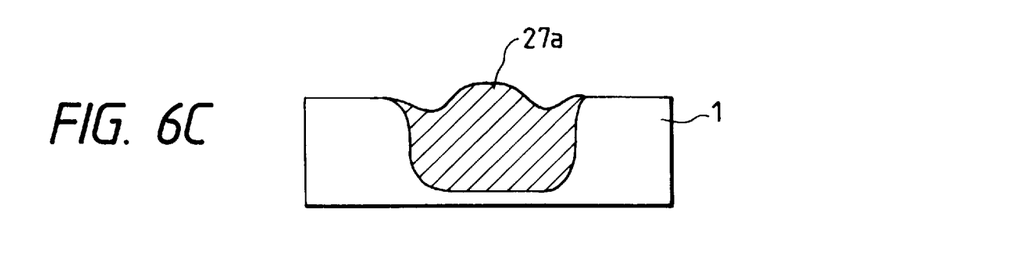

The sequential stages of a method of manufacturing a semiconductor device in accordance with a fifth embodiment of the present invention are depicted in FIGS. 6A to 6C. This embodiment comprises initial stages similar to the initial stages of the third embodiment of the present invention, wherein second silicon oxide film 22 is formed on the exposed portion of silicon substrate 1 in groove 12. Subsequently, a polysilicon film is deposited on silicon substrate 1 and anisotropically etching to expose second silicon oxide film 22 at the bottom of groove 12, leaving polysilicon sidewall 25 in the opening 11 and in groove 12, as shown in FIG. 6A. A second silicon nitride film is then deposited on silicon substrate 1 and anisotropically etched to expose second silicon oxide film 22 at the bottom of groove 12, leaving second silicon nitride sidewall 26 on polysilicon sidewall 25 in opening 11 and groove 12, as also shown in FIG. 6A. The second silicon nitride film is anisotropically etched under conditions having high selectivity for second silicon oxide film 22. In order to enhance selectivity, an etching gas, such as $CH_3F$ and $CH_2F_2$, is employed to improve selectivity.

Subsequently, as in the previously disclosed embodiments of the present invention, silicon substrate 1 is thermally oxidized to form element isolation oxide film 27, as shown in FIG. 6B. First and second silicon nitride films 3 and 26, respectively, and first silicon oxide film 2, are then removed, as by conventional etching techniques, to form element isolation region 27a, as shown in FIG. 6C.

Thus, in accordance with the fifth embodiment of the present invention, the advantages achieved in the previously disclosed first, second, third and fourth embodiments are also achieved. In addition, when second silicon nitride sidewall 26 is formed in groove 12 in accordance with the fifth embodiment, second silicon oxide film 22 remains on the bottom of groove 12, thereby preventing damage to silicon substrate 1 due to ions introduced during anisotropic etching, and improving the uniformity of the upper surface of element isolation region 27a, thereby facilitating subsequent patterning. In this manner, an increase in the junction leakage current is suppressed.

Figure 7A:
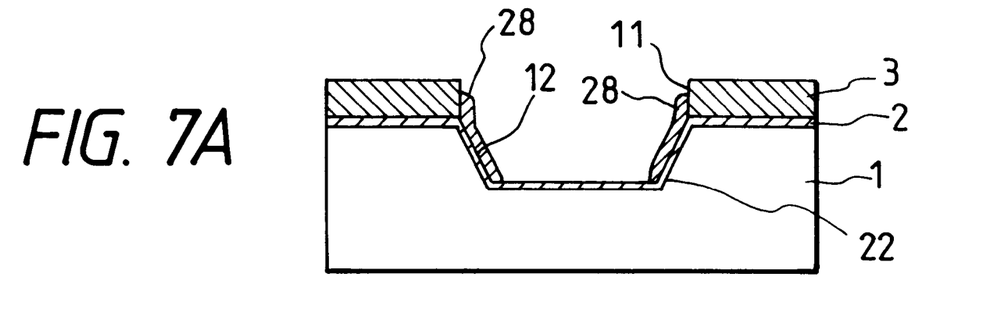
FIGS. 7A to 7D are sectional views depicting sequential stages of a method of manufacturing a semiconductor device in accordance with another embodiment of the present invention.

The sequential stages of a method of manufacturing a semiconductor device in accordance with the sixth embodiment of the present invention are depicted in FIGS. 7A to 7D. The sixth embodiment of the present invention comprises initial stages similar to the initial stages of the fifth embodiment of the present invention. In accordance with the sixth embodiment, a polysilicon film is deposited on silicon substrate 1 and anisotropically etched so that the upper end of the polysilicon film is below the upper surface of opening 11 and under first silicon nitride film 3. In this way, polysilicon film 28 is formed on the remaining sidewall of opening 11 and groove 12, as shown in FIG. 7A.

Figure 7B:
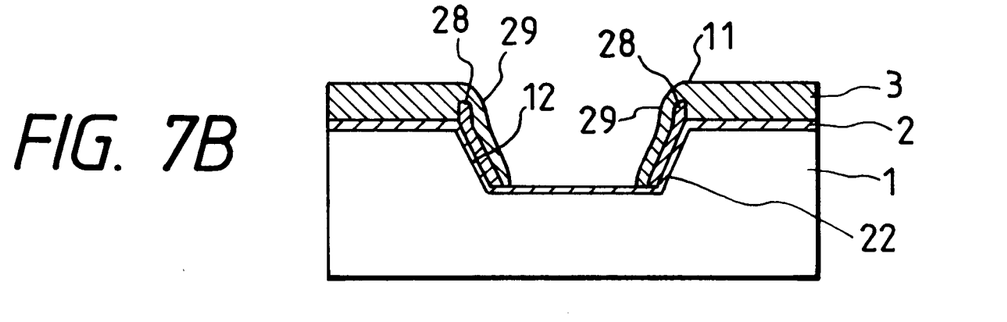

Subsequently, as in the fifth embodiment, a second silicon nitride film is deposited on the silicon substrate 1 and anisotropically etched to expose second silicon oxide film 22, leaving a silicon nitride sidewall 29 on polysilicon sidewall 28.

Figure 7C:
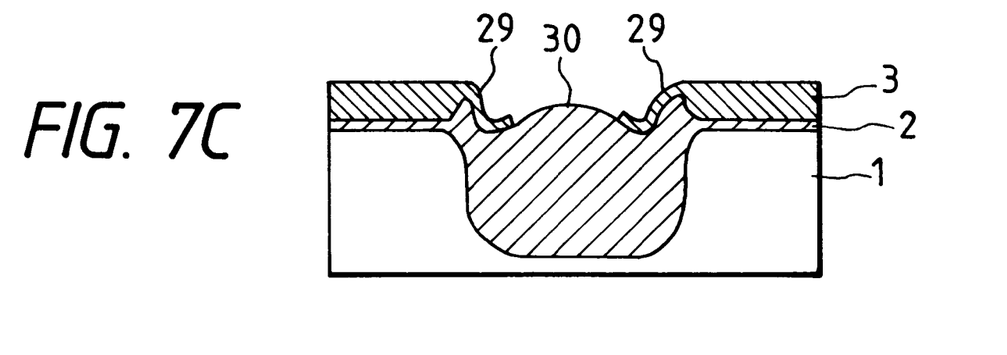
Figure 7D:
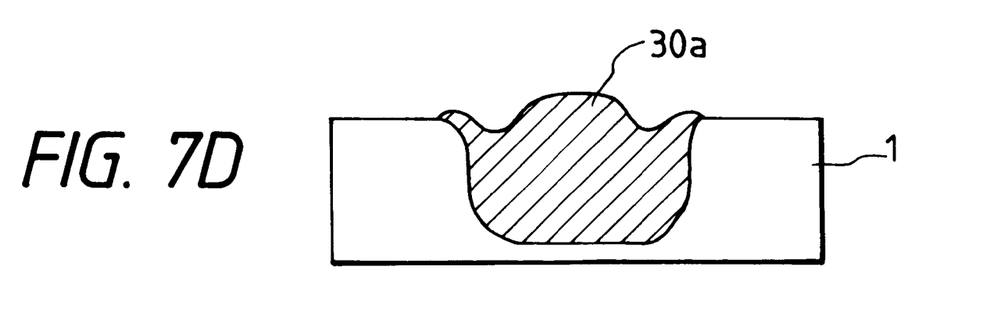

Silicon substrate 1 is then thermally oxidized to form an element isolation oxide film 30, as shown in FIG. 7C. Subsequently, the first and second silicon nitride films 3 and 29, respectively, and first silicon oxide film 2, are removed to form an element isolation region 30a, as shown in FIG. 7D.

Thus, in accordance with the sixth embodiment of the present invention, advantages are achieved similar to those achieved in the fifth embodiment of the present invention. In addition thereto, second silicon nitride sidewall 29 in groove 12 is formed integrally with first silicon nitride film 3 at the opening, thereby limiting the intrusion of an oxidation agent from the bottom of groove 12 during thermal oxidation of silicon substrate 1, and, consequently, advantageously further suppressing the generation of a bird's beak.

In accordance with the seventh embodiment of the present invention, each of the previous embodiments is modified by providing a non-monocrystalline silicon film, preferably a polycrystalline silicon film, between the first silicon oxide film 2 and first silicon nitride film 3. Since the length of the bird's beak depends upon the ratio of the thickness of the first silicon nitride film and other films (the first silicon oxide film and polysilicon film in this embodiment), the film thickness of the first silicon nitride film can be increased by the presence of the polysilicon film. Therefore, the polysilicon film serves as a mask to a greater extent than the first silicon nitride film during thermal oxidation of the silicon substrate.

In accordance with the eighth embodiment of the present invention, each of the previous embodiments described is modified so that the first silicon oxide film is formed by CVD rather than thermal oxidation, because CVD imparts a greater relaxation of stress than thermal oxidation.

In accordance with the ninth embodiment of the present invention, each of the previous embodiments is modified by employing a silicon nitride/oxide film in lieu of first silicon oxide film 2. A silicon nitride/oxide film effectively relieves stress imposed by subsequently formed silicon nitride film 3 and suppresses diffusion of an oxidation agent, thereby further reducing the length of the bird's beak.

In accordance with the tenth embodiment of the present invention, the first silicon oxide film 2 employed in the previously disclosed embodiments is replaced with a multilayer film comprising a silicon oxide film and a film of silicon nitride/oxide can be sequentially deposited. In this embodiment, the diffusion of an oxidation agent into the silicon substrate 1 is suppressed. In addition, the diffusion of nitrogen in the silicon substrate 1 is depressed, thereby avoiding the occurrence of fixed electric charges. In this way, a highly reliable semiconductor device is manufactured.

In accordance with the eleventh embodiment of the present invention, in each of the previous embodiments, a non-monocrystalline silicon film apart from polysilicon is employed. Therefore, in accordance with the eleventh embodiment of the present invention, an amorphous silicon film can be employed to reduce deterioration of an element isolation region, in lieu of a polysilicon film, by virtue of its high degree of controllability of the deposited film thickness.

In accordance with the twelfth embodiment of the present invention, each of the previous embodiments is modified by expanding the taper of groove 12 from an angle of 30 to an angle between about 20 and about 45°. In this way, swelling of the second silicon nitride film on the sidewall of the groove is improved, thereby facilitating machining of the groove.

Thus, in accordance with the present invention, damage and stress to the silicon substrate during formation of an element isolation region by LOCOS is prevented. In addition, reduction in the film thickness of the first oxidation resistant film, such as silicon nitride, is prevented. The resulting semiconductor device is characterized by an element isolation region exhibiting a uniformly flattened surface and suppression of the bird's beak. In addition, various embodiments of the present invention achieve additional advantages, such as promotion of the oxidation of the non-monocrystalline silicon film, increased depth of the element isolation region, prevention of formation of a crystal lattice in the silicon substrate, suppression of diffusion of an oxidation agent and nitride into the silicon substrate, thereby improving the reliability of the resulting semiconductor device by avoiding fixed charges, and the prevention of formation of defects in the silicon substrate. The present invention can be applied to any of various types of semiconductor devices wherein element isolation regions are formed.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device, which method comprises:

forming an insulating film on a silicon substrate;

depositing a first oxidation resistant film on the insulating film;

forming an opening through the insulating film and the first oxidation resistant film to expose a portion of the upper surface of the silicon substrate;

etching the exposed portion of the silicon substrate to form a groove in the silicon substrate;

depositing a non-monocrystalline silicon film of polycrystalline or amorphous silicon on the resulting structure;

depositing a second oxidation-resistant film on the non-monocrystalline silicon film;

anisotropically etching the second oxidation resistant film to expose the non-monocrystalline silicon film at the bottom of the groove, leaving a second oxidation resistant sidewall in the opening and the groove; and thermally oxidizing the silicon substrate using the remaining portions of the first and second oxidation resistant films as a mask to form an element isolation region.

2. The method according to claim 1, wherein the insulating film comprises silicon oxide, silicon oxynitride, or a composite of a silicon oxide film and a silicon oxynitride film thereon.

3. The method according to claim 1, wherein the first and/or second oxidation resistant film comprises silicon nitride.

4. The method according to claim 1, wherein the first oxidation resistant film comprises a laminate including a layer of non-monocrystalline silicon on the insulating film.

5. The method according to claim 1, wherein the non-monocrystalline silicon film comprises polycrystalline silicon.

6. The method according to claim 1, wherein the sidewall of the groove has an angle of about 20 to about 45° with respect to the direction perpendicular to the surface of the silicon substrate.

7. A method in manufacturing a semiconductor device, which method comprises:

forming an insulating film on a silicon substrate;

depositing a first oxidation resistant film on the insulating film;

forming an opening through the insulating film and the first oxidation resistant film to expose a portion of the silicon substrate;

etching the exposed portion of the silicon substrate to form a groove in the silicon substrate;

depositing a non-monocrystalline silicon film of polycrystalline or amorphous silicon on the resulting structure;

depositing a silicon oxide film on the non-monocrystalline silicon film;

depositing a second oxidation resistant film on the silicon oxide film;

anisotropically etching the second oxidation resistant film to expose the silicon oxide film at the bottom of the groove, leaving a second oxidation resistant sidewall in the opening and the groove; and thermally oxidizing the substrate using the remaining portions of the first and second oxidation resistant films as a mask to form an element isolation region.

8. The method according to claim 7, wherein the insulating film comprises silicon oxide, silicon oxynitride, or a composite of a silicon oxide film and a silicon oxynitride film thereon.

9. The method according to claim 7, wherein the first and/or second oxidation resistant film comprises silicon nitride.

10. The method according to claim 7, wherein the first oxidation resistant film comprises a laminate including a layer of non-monocrystalline silicon on the insulating film.

11. The method according to claim 7, wherein the non-monocrystalline silicon film comprises polycrystalline silicon.

12. The method according to claim 7, wherein the sidewall of the groove has an angle of about 20 to about 45° with respect to the direction perpendicular to the surface of the silicon substrate.

13. A method of manufacturing a semiconductor device, which method comprises:

forming an insulating film on a silicon substrate;

depositing a first oxidation resistant film on the insulating film;

forming an opening through the insulating film and first oxidation resistant film to expose a portion of the silicon substrate;

etching the exposed portion of the silicon substrate to form a groove in the silicon substrate;

forming a silicon oxide film on the exposed portion of the silicon substrate in the groove;

depositing a non-monocrystalline silicon film of polycrystalline or amorphous silicon on the resulting structure;

depositing a second oxidation resistant film on the non-monocrystalline silicon film;

anisotropically etching the second oxidation resistant film to expose the non-monocrystalline silicon film at the bottom of the groove with the silicon oxide film thereunder, leaving a second oxidation resistant sidewall in the opening and the groove; and thermally oxidizing the silicon substrate using the remaining portions of the first and second oxidation resistant films as a mask to form an element isolation region.

14. The method according to claim 13, wherein the insulating film comprises silicon oxide, silicon oxynitride, or a composite of a silicon oxide film and a silicon oxynitride film thereon.

15. The method according to claim 13, wherein the first and/or second oxidation resistant film comprises silicon nitride.

16. The method according to claim 13, wherein the first oxidation resistant film comprises a laminate including a layer of non-monocrystalline silicon on the insulating film.

17. The method according to claim 13, wherein the non-monocrystalline silicon film comprises polycrystalline silicon.

18. The method according to claim 13, wherein the sidewall of the groove has an angle of about 20 to about 45° with respect to the direction perpendicular to the surface of the silicon substrate.

19. A method of manufacturing a semiconductor device, which method comprises:

forming an insulating film on a semiconductor substrate;

depositing a first oxidation film on the insulating film;

forming an opening through the insulating film and the first oxidation resistant film to expose a portion of the silicon substrate;

etching the exposed portion of the silicon substrate to form a groove in the silicon substrate;

forming a silicon oxide film on the exposed portion of the silicon substrate in the groove;

depositing a non-monocrystalline silicon film of polycrystalline or amorphous silicon on the resulting structure;

depositing a second oxidation resistant film on the non-monocrystalline silicon film;

anisotropically etching the second oxidation resistant film and the non-monocrystalline silicon film to expose the silicon oxide film at the bottom of the groove, leaving a second oxidation resistant sidewall groove with a portion of the non-monocrystalline silicon film thereunder in the groove;

thermally oxidizing the silicon substrate using the remaining portions of the first and second oxidation resistant films as a mask to form an element isolation region.

20. The method according to claim 19, wherein the insulating film comprises silicon oxide, silicon oxynitride, or a composite of a silicon oxide film and a silicon oxynitride film thereon.

21. The method according to claim 19, wherein the first and/or second oxidation resistant film comprises silicon nitride.

22. The method according to claim 19, wherein the first oxidation resistant film comprises a laminate including a layer of non-monocrystalline silicon on the insulating film.

23. The method according to claim 19, wherein the non-monocrystalline silicon film comprises polycrystalline silicon.

24. The method according to claim 19, wherein the sidewall of the groove has an angle of about 20 to about 45° with respect to the direction perpendicular to the surface of the silicon substrate.

25. A method of manufacturing a semiconductor device, which method comprises:

forming an insulating film on a silicon substrate;

depositing a first oxidation resistant film on the insulating film;

forming an opening through the insulating film and the first oxidation resistant film to expose a portion of the silicon substrate;

etching the exposed upper portion of the silicon substrate at the opening to form a groove in the silicon substrate;

forming a silicon oxide film on the exposed portion of the silicon substrate in the groove;

depositing a non-monocrystalline silicon film of polycrystalline or amorphous silicon on the resulting structure;

anisotropically etching the non-monocrystalline silicon film leaving the silicon oxide film across the entire bottom of the groove exposed after anisotropic etching of the non-monocrystalline silicon film is completed, leaving a non-monocrystalline silicon sidewall in the opening and the groove;

depositing a second oxidation resistant film on the resulting silicon substrate;

anisotropically etching the second oxidation resistant film leaving the silicon oxide film across the entire bottom of the groove exposed after anisotropic etching of the second oxidation resistant film is completed, leaving a second oxidation resistant sidewall in the groove with the non-monocrystalline silicon sidewall thereunder; and thermally oxidizing the silicon substrate, with the silicon oxide film across the entire bottom of the groove, using the remaining portions of the first and second oxidation resistant films as a mask to form an element isolation region.

26. The method according to claim 25, wherein the insulating film comprises silicon oxide, silicon oxynitride, or a composite of a silicon oxide film and a silicon oxynitride film thereon.

27. The method according to claim 25, wherein the first and/or second oxidation resistant film comprises silicon nitride.

28. The method according to claim 25, wherein the first oxidation resistant film comprises a laminate including a layer of non-monocrystalline silicon on the insulating film.

29. The method according to claim 25, wherein the non-monocrystalline silicon film comprises polycrystalline silicon.

30. The method according to claim 25, wherein the sidewall of the groove has an angle of about 20 to about 45° with respect to the direction perpendicular to the surface of the silicon substrate.

31. The method according to claim 25, wherein the non-monocrystalline silicon film is etched back so that its upper surface is lower than the surface of the oxidation resistant film and, after anisotropically etching the second oxidation resistant film, the second oxidation resistant sidewall is formed integrally with the first oxidation resistant film.

* * * * *